(12) United States Patent
Gadd

(10) Patent No.: US 7,231,855 B2
(45) Date of Patent: Jun. 19, 2007

(54) METHOD AND RELATED APPARATUS FOR CUTTING A PRODUCT FROM A SHEET MATERIAL

(75) Inventor: Michael William Gadd, Singapore (SG)

(73) Assignee: JETSIS International Pte Ltd, Singapore (SG)

( * ) Notice: Subject to any disclaimer, the term of this patent is extended or adjusted under 35 U.S.C. 154(b) by 101 days.

(21) Appl. No.: 10/500,273

(22) PCT Filed: Dec. 27, 2002

(86) PCT No.: PCT/SG02/00297

§ 371 (c)(1),
(2), (4) Date: May 4, 2005

(87) PCT Pub. No.: WO03/055654

PCT Pub. Date: Jul. 10, 2003

(65) Prior Publication Data

US 2005/0235789 A1    Oct. 27, 2005

(30) Foreign Application Priority Data

Dec. 28, 2001   (SG) ................................ 200108105

(51) Int. Cl.
*B26D 5/00*   (2006.01)

(52) U.S. Cl. .............................. 83/13; 83/177; 83/404; 83/425

(58) Field of Classification Search ............ 83/98–100, 83/177, 425, 425.2, 425.3, 425.4, 939–941, 83/404, 408, 404.1, 13

See application file for complete search history.

(56) References Cited

U.S. PATENT DOCUMENTS

| | | | | | |
|---|---|---|---|---|---|
| 3,818,790 | A | * | 6/1974 | Culp et al. ..................... | 83/408 |
| 3,927,592 | A | * | 12/1975 | Nienstedt .................... | 83/404.2 |
| 4,949,610 | A | * | 8/1990 | Jones et al. ................... | 83/177 |
| 6,125,729 | A | * | 10/2000 | Mirabello ..................... | 83/177 |
| 6,155,245 | A | * | 12/2000 | Zanzuri ....................... | 125/12 |
| 6,634,928 | B2 | * | 10/2003 | Erickson et al. .............. | 451/40 |

FOREIGN PATENT DOCUMENTS

JP          10128570 A       5/1998

* cited by examiner

*Primary Examiner*—Kenneth E. Peterson
*Assistant Examiner*—Phong Nguyen
(74) *Attorney, Agent, or Firm*—Wells St. John P.S.

(57) ABSTRACT

A method of cutting a product of a predetermined shape from a sheet material (1) by firstly supporting a sheet material in a first position by a first support means (2) whereafter she sheet (1) may be cut through by moving a line type cutter (7) relative to the sheet material on a line or lines to define part of the predetermined shape. The sheet material may then be supported in a second position (whether by the first support means or another support means (2a, 2b)) and again cut by moving a line type cutter relative to the sheet material on a line or lines to define the remaining perimeter of the predetermined shape, to thereby cut the predetermined shape from the sheet material. In the second position the sheet material is provided with upward support to support the predetermined shape to be cut from the sheet material and wherein in the second position the or another support means includes a through cut commensurate to the line or lines to define the remaining perimeter of the predetermined shape.

20 Claims, 11 Drawing Sheets

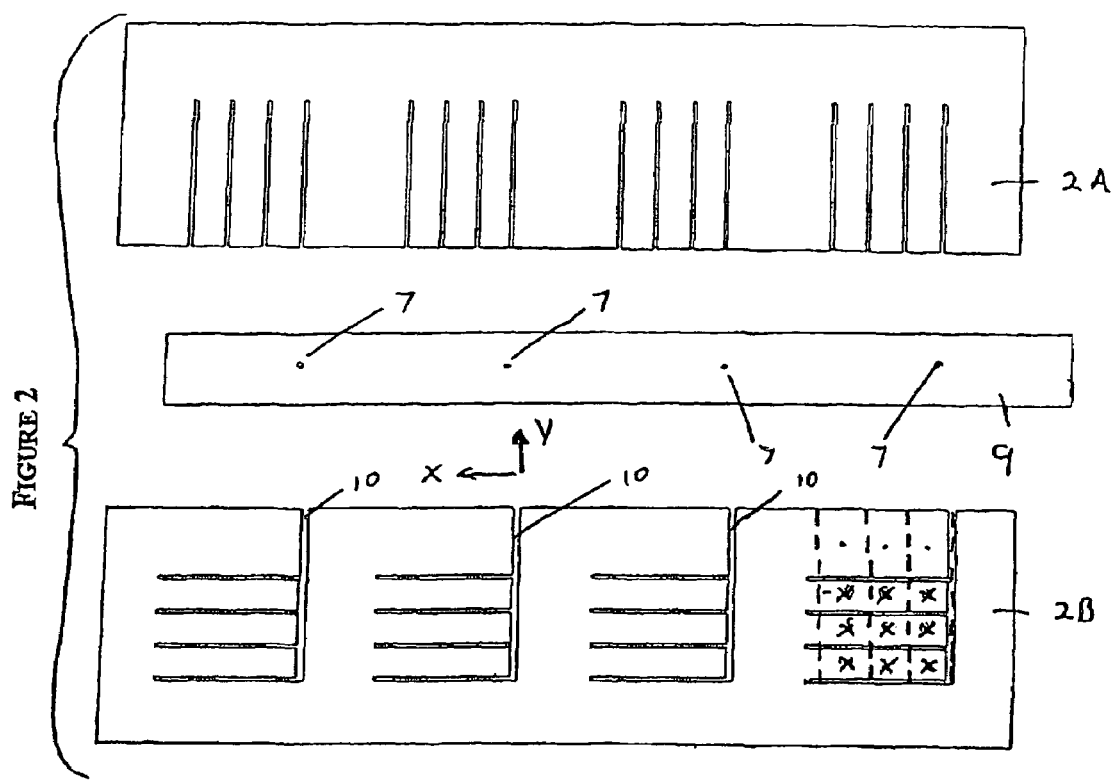
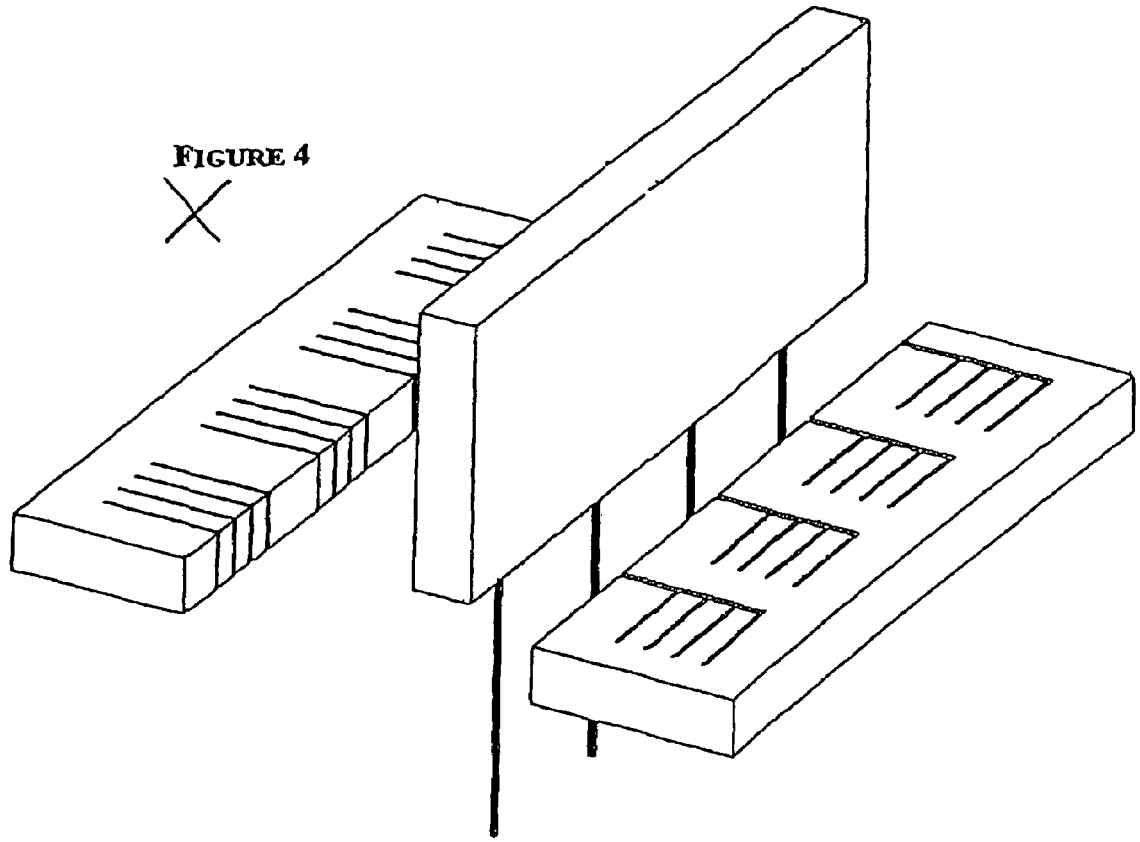

METHOD AND RELATED APPARATUS FOR CUTTING A PRODUCT FROM A SHEET MATERIAL

RELATED PATENT DATA

This application claims priority to Patent Cooperation Treaty application Ser. No. PCT/SG02/00297, which was filed Dec. 27, 2002, and which claims priority to Singapore Application Ser. No. 200108105-8, which was filed Dec. 28, 2001.

FIELD OF THE INVENTION

The present invention relates to a method and related apparatus for cutting a product from a sheet material.

BACKGROUND OF INVENTION

The cutting of predetermined shapes from a sheet material may be achieved by using a laser or fluid jet or similar. When using a fluid jet to cut such material is it very difficult to control the depth of cut accurately. Indeed normally the material is cut all the way through its entire thickness with the jet passing through the material from one side another. The sheet material is normally secured by a fixture which supports the sheet material to allow for the jet to pass from one side to the other without the jet being unnecessarily disbursed or impinging on other parts of the fixture. By way of example, a fixture may hold a sheet material above a water filled tank and from the other side of which the jet impinges onto the sheet to cut through the sheet thereafter being directed into the water filter tank to disburse any remaining jet energy.

When it comes to methods to hold the sheet material, limitations arise especially if the jet used to cut the material may, once passed through the material still has sufficient energy to cause damage to the portions of the fixture on the other side of the sheet material. Whilst the sheet material may be held at its perimeter region allowing for a clear passage of cutting fluid to pass through the sheet material and into the tank beneath, the product cut from the sheet material will subsequently fall into the tank of water from which it will need to be removed. The product cut from the sheet material floating around in the tank may become damaged from subsequent jet action being directed into the tank of water. For cutting of small squares or rectangles for example the method of fixing the sheet is of real concern as the jet needs to be able to pass freely through the sheet and then passed the fixture, into the water tank without damaging the fixture. The fixture must simultaneously be designed to support the parts once separated by the cutting action. Where the fixture is able to maintain support to the sheet by extending below and inwardly from the perimeter of the sheet, the cutting of a product from the sheet material is not a problem. However as soon as a product to be cut is to be generated entirely inwardly from the perimeter of the sheet, support by the fixture to that product to be removed from the sheet can no longer occur where the sheet and the fixture remain in a fixed relationship to each other during the cutting process.

Accordingly without providing a hole in the fixture about the product to be cut from the sheet, but to remain supported by the fixture the cutting process can not be performed without the jet also impinging on part of the fixture itself. To avoid the jet impinging on the fixture itself in such a relationship, a hole in the fixture of a greater size to the product to be cut from the sheet must be provided which, once the product is entirely cut from the sheet will result in the product from falling through and away from the fixture.

For certain cutting procedures it is also imperative that a high degree of accuracy of the items cut from a sheet is achieved to within very close tolerances. This is particularly so in relation to the cutting items from a sheet to be used in circuit board or other electronic type applications. Therefore in mounting a sheet for cutting it is desirable for the sheet to remain in a relationship to the cutting device wherein the relationship remains constant such that during a computer controlled cutting of the sheet, no margin of error can be introduced between the relative positioning of the cutting device and sheet as a result of for example the movement of the sheet between different cutting stations.

Accordingly it is an object of the present invention to provide a method and related apparatus for cutting a product from a sheet material which overcomes the abovementioned difficulties or which will at least provide the public with a useful choice.

BRIEF DESCRIPTION OF THE INVENTION

In a further aspect the present invention consists in a method of cutting a product from a sheet material as herein described and with reference to the accompanying drawings.

This invention may also be said broadly to consist in the parts, elements and features referred to or indicated in the specification of the application, individually or collectively, and any or all combinations of any two or more of said parts, elements or features, and where specific integers are mentioned herein which have known equivalents in the art to which this invention relates, such known equivalents are deemed to be incorporated herein as if individually set forth.

BRIEF DESCRIPTION OF THE DRAWINGS

FIG. 2 is a plan view of two support means both being in the form of support tables and a multi-head cutting unit, showing an example of a pattern of cuts provided through the two supporting support means to produce a product by cutting, of squares or rectangles from a sheet material, FIG. 4 is a perspective view of a multi-head cutting unit and the two support means as shown in FIG. 2.

DETAILED DESCRIPTION OF THE INVENTION

Figure 1:
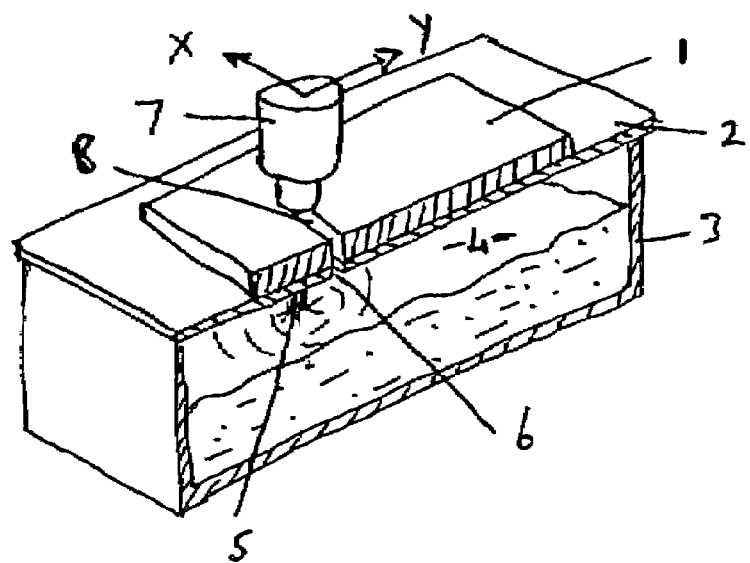
FIG. 1 is a perspective and cut away view of an apparatus of the present invention provided for cutting a product from a sheet material.

The present invention allows for a shape to be cut from a sheet material by using a line type cutting apparatus such as for example an abrasive fluid jet, laser, wire spark erosion, flame cutting or similar. With reference to FIG. 1, the sheet 1 is able to be mounted by a support means 2 which provides a support to the sheet 1 at least whilst it is being subjected to the cutting action by the cutting means. In this example the support is from below the sheet. Most preferably the support means is substantially horizontal and the cutting means is directed from above the support means and directs its jet or beam or flame downwardly and into a water filled container 3 which contains water 4 to disburse the energy of the jet 5. The support means 2 preferably locates the sheet 1 securely thereon so that it does not move relative to the support means at least during the process of cutting the material. The sheet 1 may be secured by a vacuum action, magnetic fastening or by a mechanical fastening means or the like. Alternative fastening means may be utilised. The support means 2 includes a support region at which the sheet is supported and wherein provided through the support means 2, there is a slot 6 which is at least commensurate with the cut that is provided through the sheet by the cutting means 7. The cutting means 7 moves relative to the sheet 1 (and the support means 2) and preferably moves along X, Y co-ordinates. Angled travel of the cutting means 7 is within the scope of the invention and indeed polar co-ordinate movement may also be utilised. The cut 8 of the sheet 1 is along a line which corresponds to the slot 6 provided through the support means 2. The slot 6 may be slightly larger in width than the width of cut provided by the jet of the cutting means 7 through the sheet 1. In this way, the support means 2 does not become damaged by the action of the jet passing through the sheet 1 and slot 6 since the path of cutting of the sheet 1 is commensurate to the slot 6 provided through the support means 2.

In order to cut objects from the sheet material where the entire perimeter of the cut object is within the boundaries of the sheet 1, a multi-step cutting process is employed by the present invention. In a first step, a first portion of the perimeter of the shape to be cut from the sheet is defined by cutting along the perimeter portion (whether 1 or more separate lines) by the jet when the sheet is supported by the support means in a first position. In this first position the slot 6 of the support means 2 extends to be commensurate with that portion of the perimeter of the shape to be cut by the jet. The sheet 1 is then moved to a second position where the blank then overlies a slot to be commensurate with the remaining portion of the perimeter of the shape to be cut from the sheet. In this subsequent position, the previously cut perimeter portion of the shape does not require to be commensurate with any slot of the second support region. Whilst in the most preferred form only two cutting steps are provided, first to define a first cut or cuts of a first portion of the perimeter and a second to define a subsequent cut or cuts to define the remaining perimeter portion of the shape to be cut from the blank, it is to be appreciated that more than two cutting steps may also achieve the same result. However for efficiency two cutting steps are sufficient.

In the most preferred form after the first cutting step the blank 1 is actually moved to a second support means, being a support table providing the slots to allow the jet to pass therethrough during the process of cutting the remainder of the perimeter of the shapes from the blank.

Figure 3:
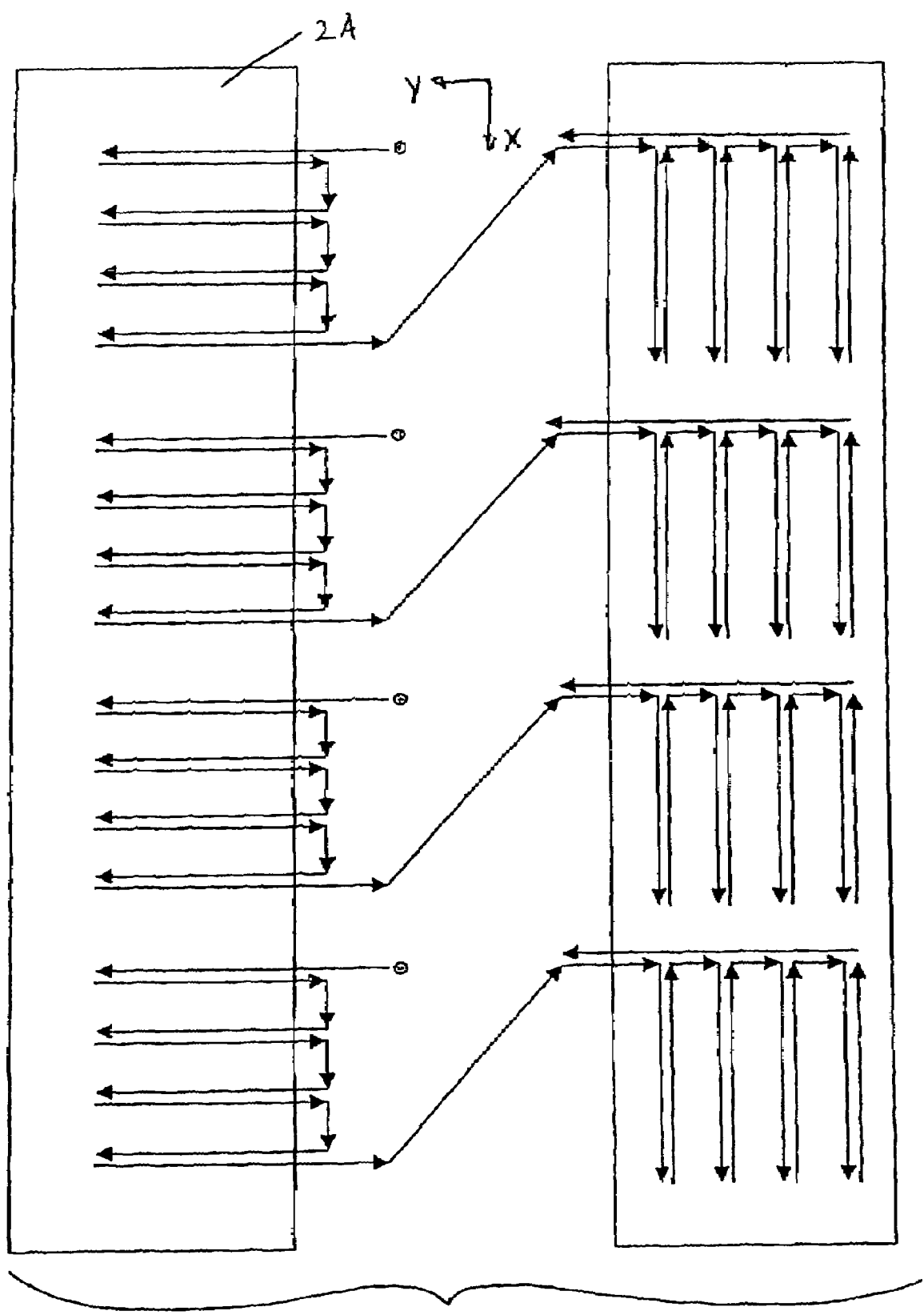
FIG. 3 is a plan view of the path of travel of the multi-head cutting unit of FIG. 2 through the slots provided in both support means.
Figure 6:
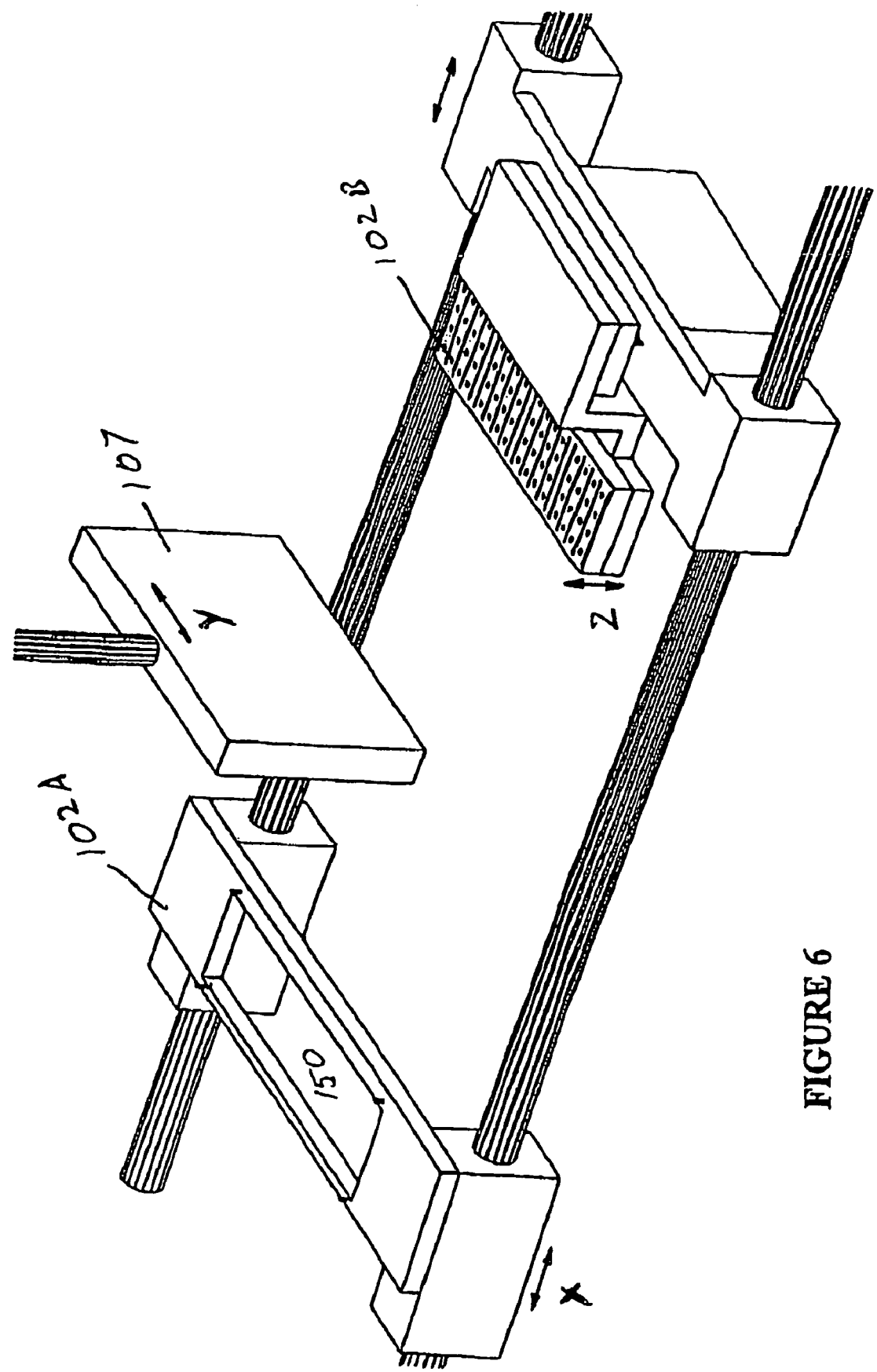
FIG. 6 is a perspective view of an alterative step up of apparatus of the present invention, without the sheet material being shown.

With reference to FIG. 2, there is shown an arrangement where two support means (2A, 2B) are provided with slots to produce by the use of four cutting means 7 moving as a unit 9, a total of 36 substantially square items and 12 rectangular items from the sheet material. In FIG. 2, the sheet material is not shown to be mounted. However in operation, the unit 9 is moved to cut the sheet material when mounted on the first support means 2A in the Y direction. In FIGS. 2 and 3, there is shown to be four Y direction cuts to be made by each of the cutting means 7 in the blank. The blank is then transferred to the support table 2B. When mounted on the support table 2B, each of the cutting means 7 operate to cut the sheet in the X direction. Again four cuts in the X direction are made to each traverse across the cuts (preferably at 90°) made during the first cutting process and thereby separate nine substantially square shaped items from the blank wherein the cut items remain supported by the support table 2B after having been completely cut.

In moving to cut along the four lines in the X direction, each cutting means 7 is firstly advanced along a feeder slot 10 extending in the Y direction. With reference to FIG. 3, the path moved by the jet is shown, in where for example the jet remains continuously operating during the movement along the lines to cut the sheet.

Figure 5:
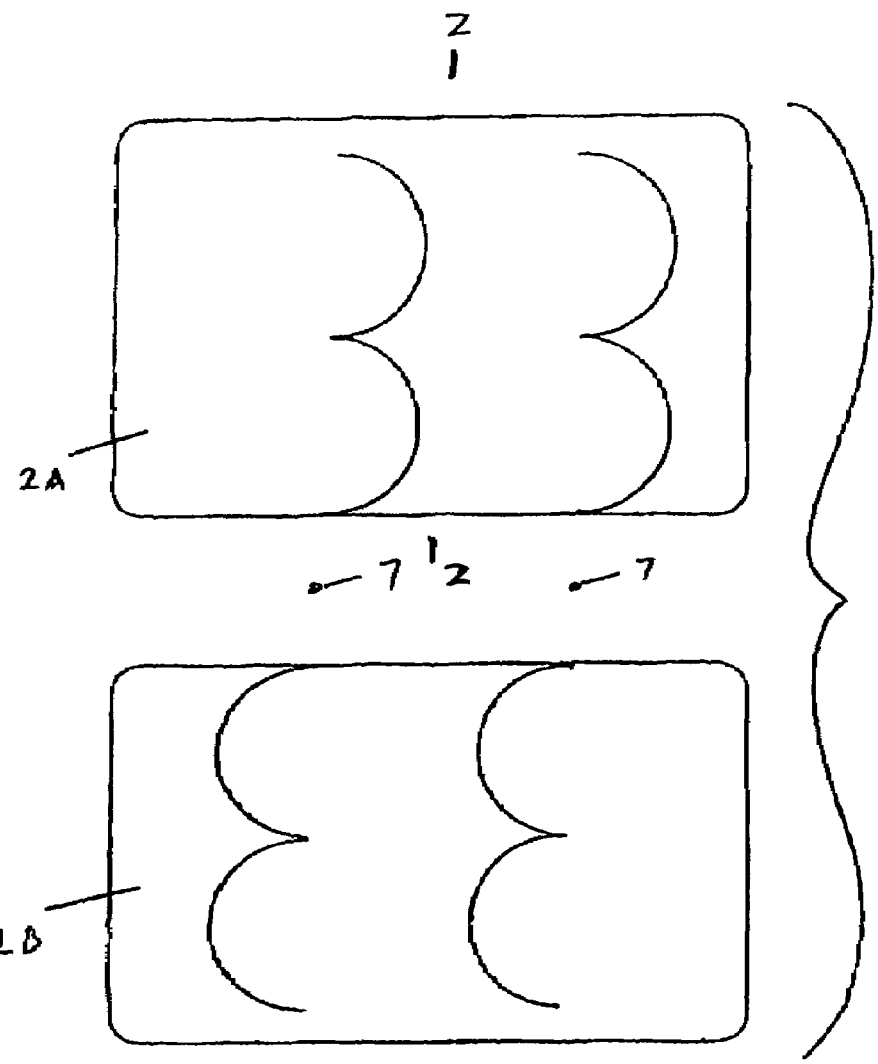
FIG. 5 is a plan view of two cutting tables.

With reference to FIG. 5, it will be appreciated that other predetermined shapes such as for example a circular shape can be cut from a sheet by first placing a sheet on the first support means 2A and for two cutting means 7 to cut along the curve lines as shown whereafter the sheet can be moved and placed on the support table 2B whereafter the two cutting means 7 can cut along the two curved lines as shown on the support means 2B to thereby complete a cutting of a perimeter of the items to be removed from the blank.

Alternative to using two different support means, the sheet may be repositioned on the same support means, utilising the same slots. In the example as shown in FIG. 5, the support means 2A may be utilised for cutting the product from the sheet wherein a first cutting step the sheet is positioned over the curved shapes to be cut substantially along this line, and wherein after the sheet is rotated about Z—Z it is subsequently cut in the second cutting step again along the curved lines but this time thereby defining the remainder of the perimeter of the shape to be cut from the sheet.

By following the cutting pattern as for example shown in FIG. 3 or 5 or similar, the design of the support means can be such that the jet will not damage the support means during the cutting process. The pre-cut substrate between the first and second cutting steps will still be rigid enough but after the first cutting step, it can be transported to be secured in the second position (whether on the same or a different support means) for the final cutting process.

The sheet may alternatively be supported during the first cutting process by a support means which need not necessarily provide slots beneath the lines to be cut in the sheet material, since the cuts provided during the first cutting process will not remove any of the product from the sheet material. However the support provided with commensurate slots during the cutting process, may reduce the vibrational effect by the cutting means transmitted to the sheet material. During the final cutting process the sheet material is preferably entirely supported by the supporting regions save for where the slots through the supporting means of the second supporting region are provided.

In FIGS. 1–13, there is shown an alternative arrangement of the apparatus of the present invention for cutting of discrete items from the sheet material. A first support means 102A is provided on a sliding X axis which moves the support means in the X direction relative to the cutting means. Such movement is preferably numerically controlled and is able to accurately control the positioning of the sheet material in the X direction relative to the cutting means 107. The cutting means 107 itself is moveable in a Y direction to control the Y direction cutting the sheet material. A support table 102B is provided to also be able to move in the X direction but also has a movement component in a Z direction.

Figure 7:
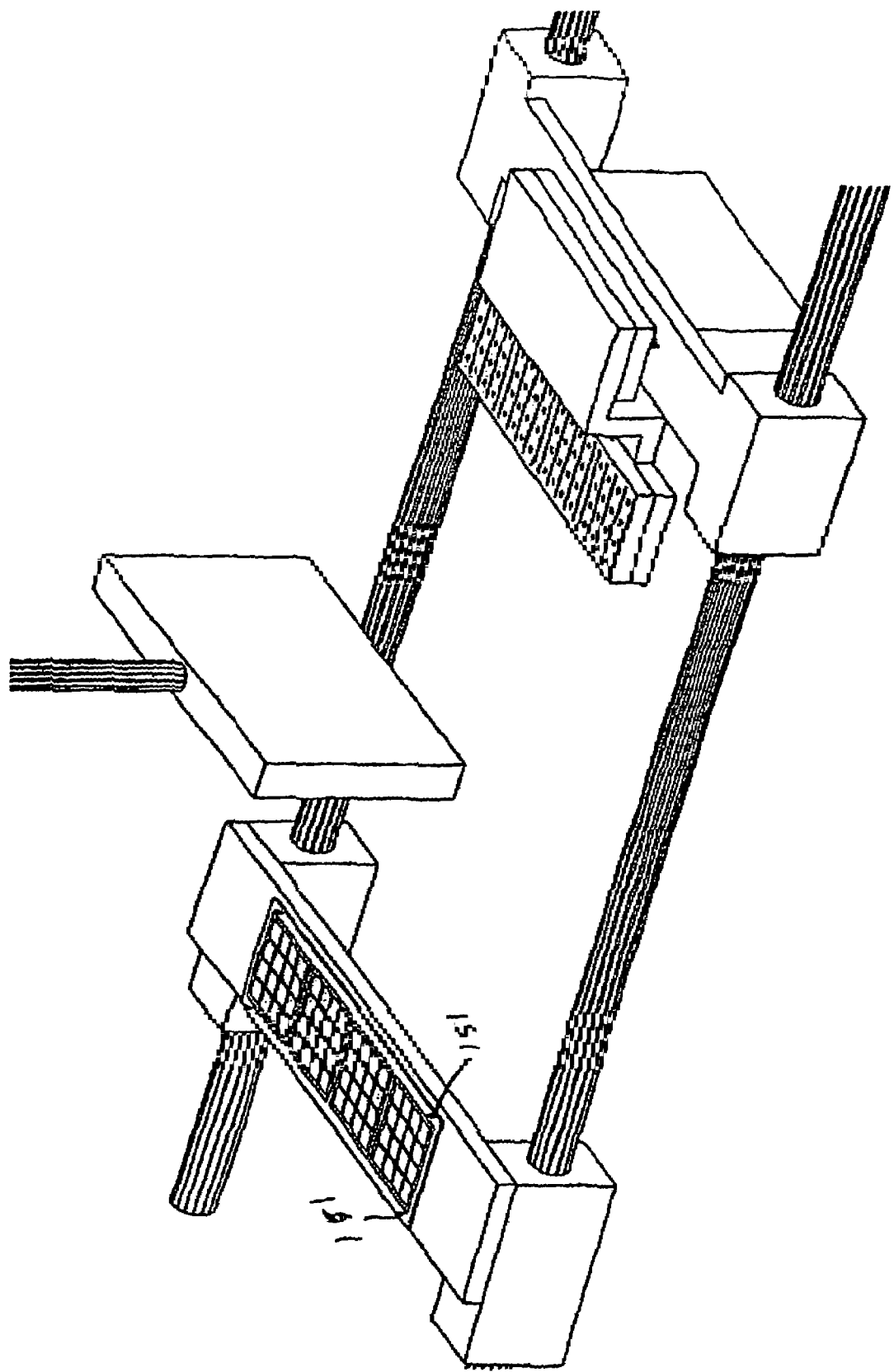
FIG. 7 is a perspective view of the step up of FIG. 6 but wherein a sheet material is provided to a support means.
Figure 8:
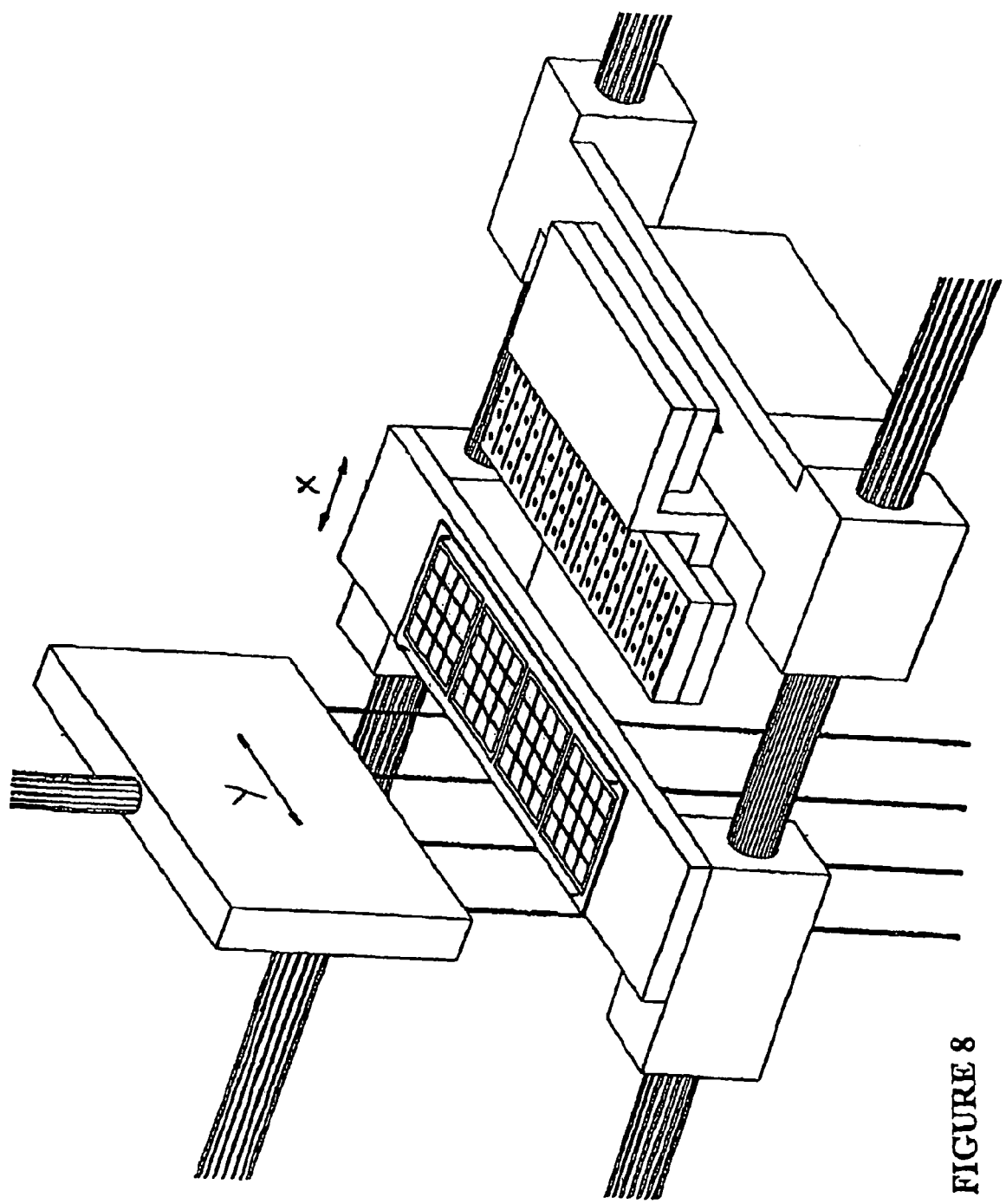
FIG. 8 illustrates the cutting means ready to commence cutting of the sheet material supported by the support means wherein movement in the X direction is provided by the support means along the rails and movement in the Y direction is provided by the cutting head.

In use a sheet material is placed on the first support means 102A as for example shown in FIG. 7. This first support means includes a single opening 150 which is provided below the regions to be cut in the first cutting procedure by the cutting means 107. The sheet material is perimeter supported by the support means and is most preferably mounted on the support means by locating pins 151 which extend through apertures in the sheet material to thereby accurately and securely locate the sheet material with the support means. Whilst the opening 150 is shown to be provided within the perimeter of the support means 102a, alternatively the opening 150 may be a rebate in the substantially rectangular form of the support means and hence a form to define part of the perimeter shape thereof.

Figure 9:
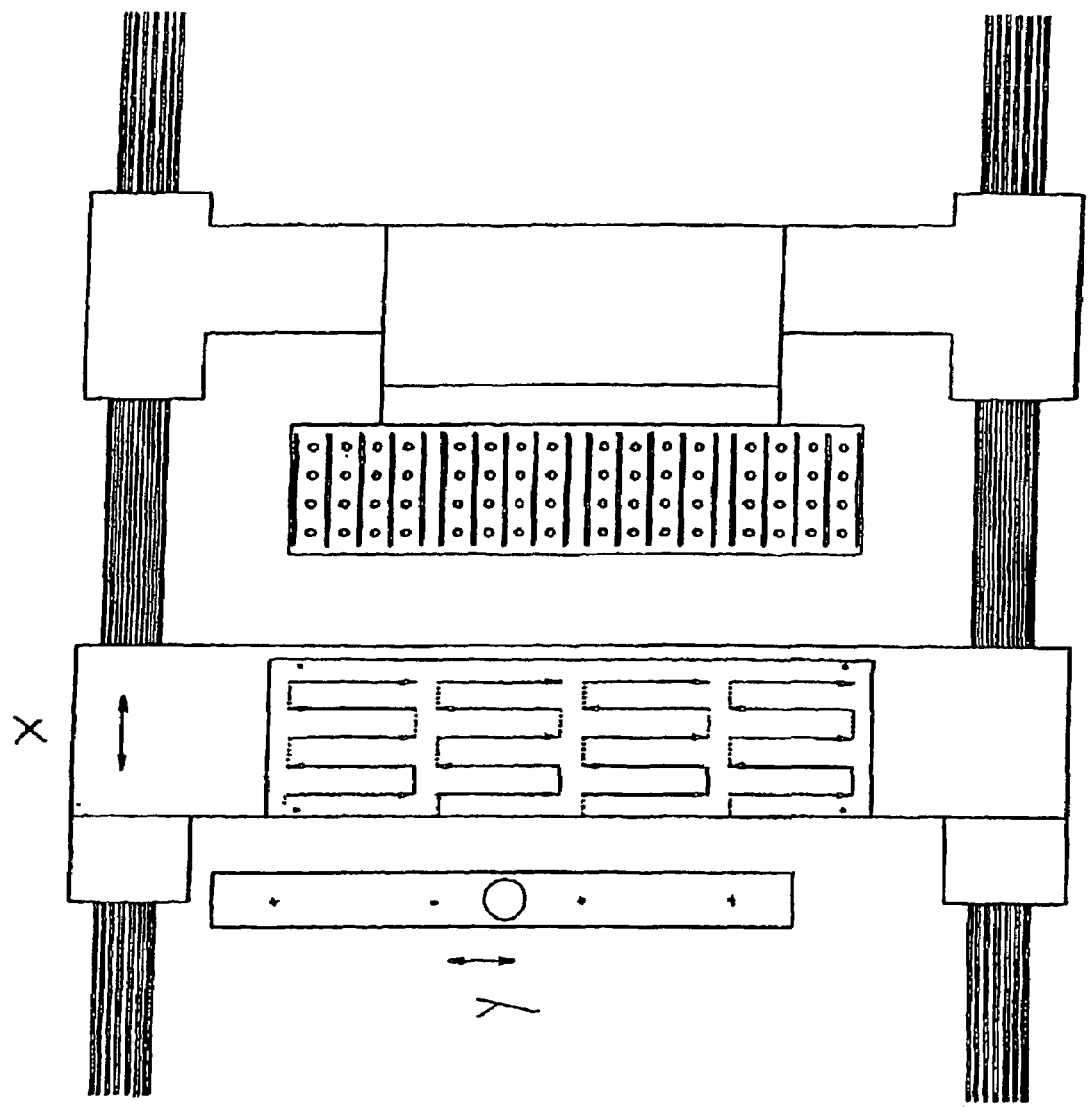
FIG. 9 is a plan view illustrating the path cut by the cutting means in the first cutting phase.
Figure 10:
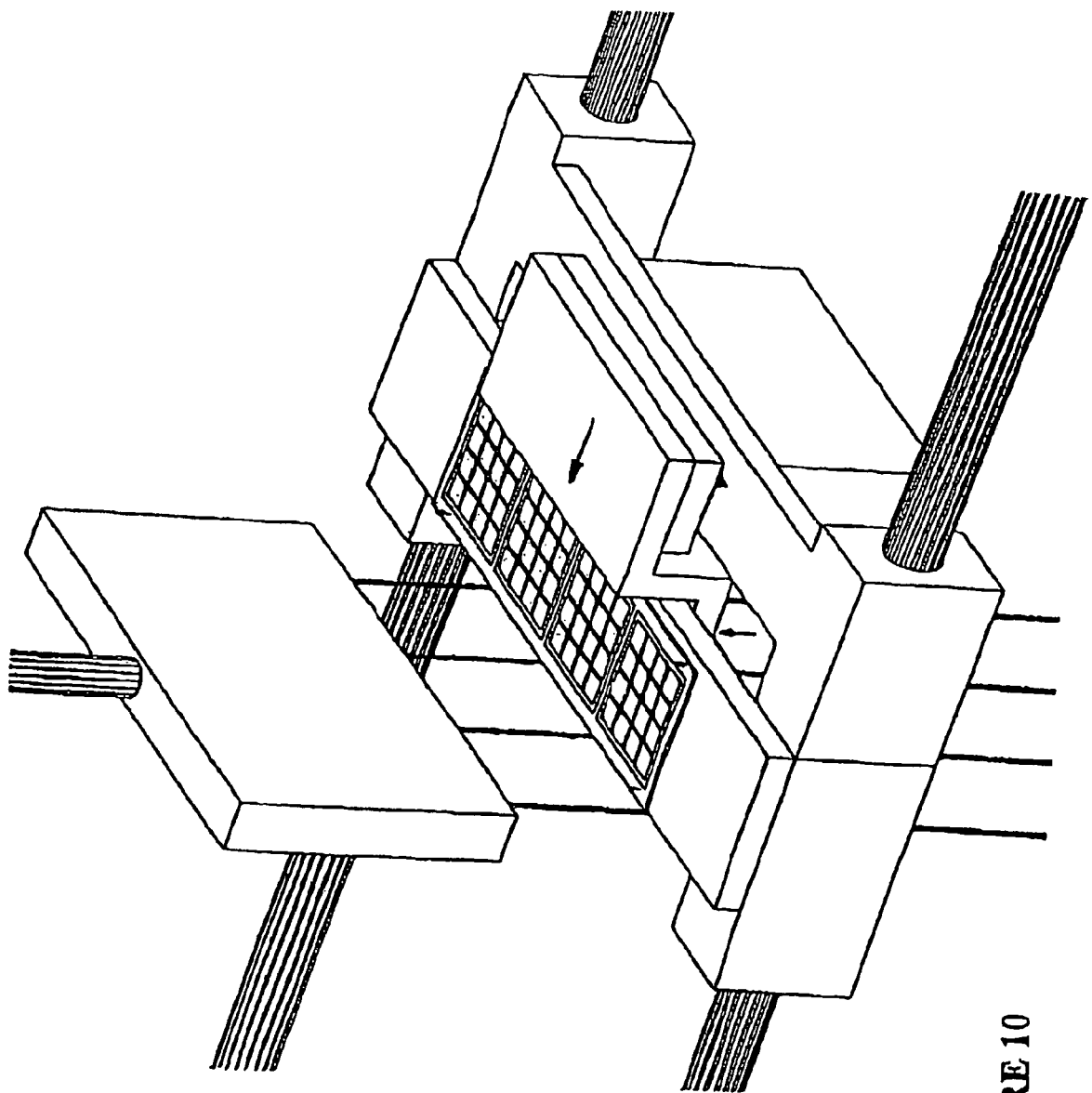
FIG. 10 is a perspective view of the apparatus of FIG. 6 wherein a second support means this time a support table is brought into an underlying relationship with the sheet material immediately prior to and during the cutting of the sheet material in the second phase.
Figure 11:
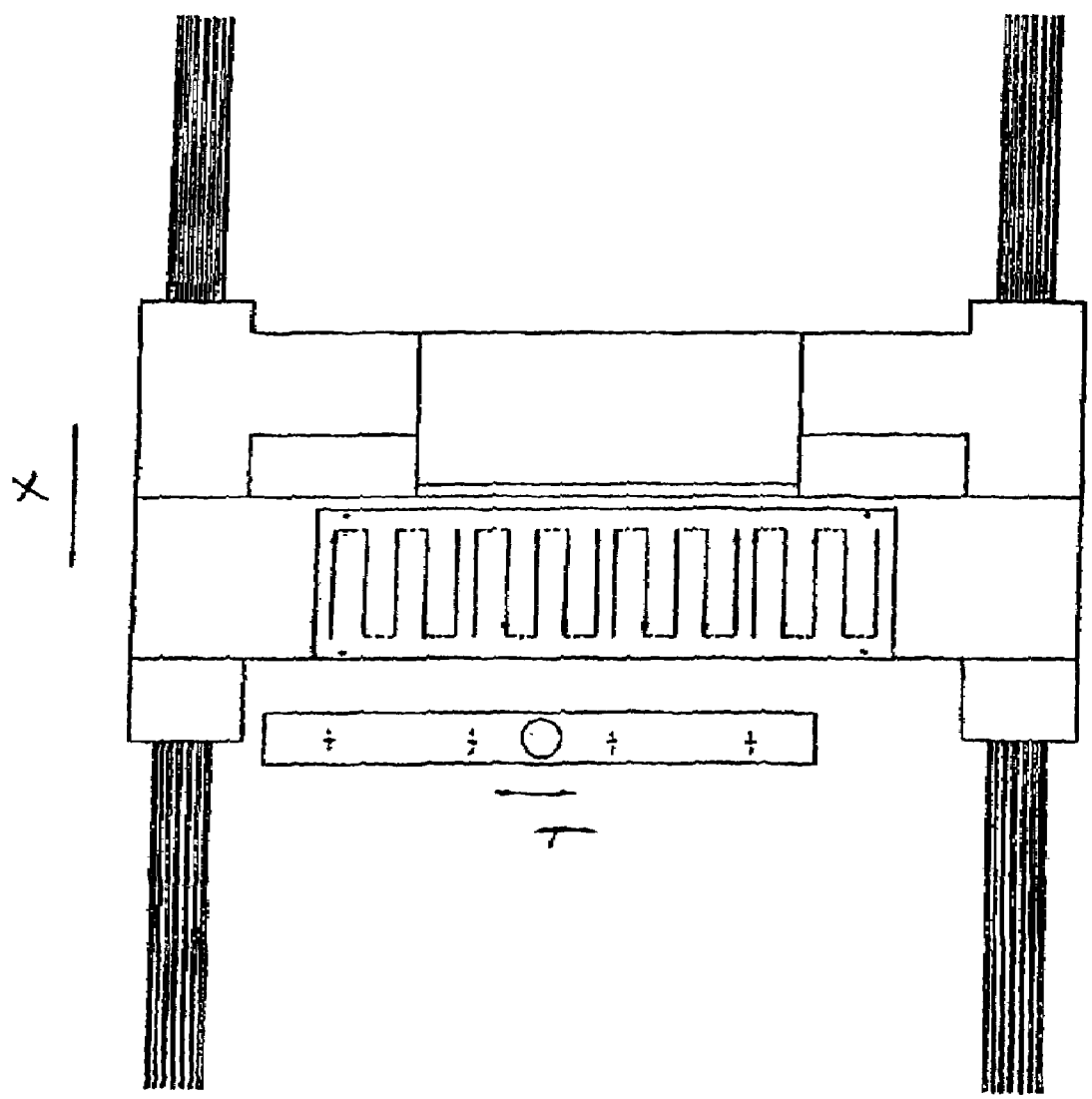
FIG. 11 is a plan view of FIG. 10 illustrating the path cut by the cutting means during the second phase.
Figure 12:
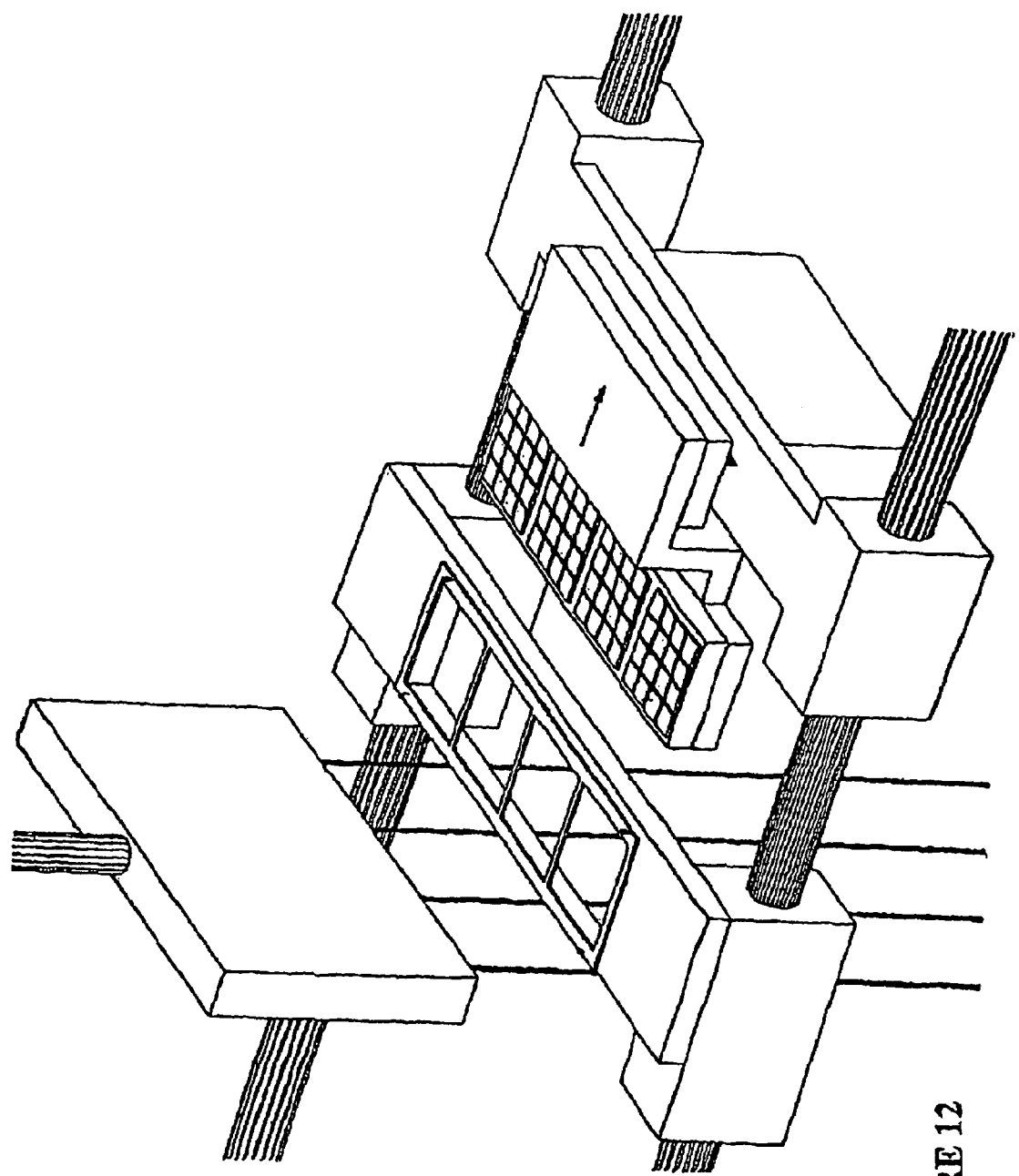
FIG. 12 illustrates the support table in a retracted condition from underlying the sheet material but where the pieces cut from the sheet material have been removed and still remain supported on the support table.
Figure 13:
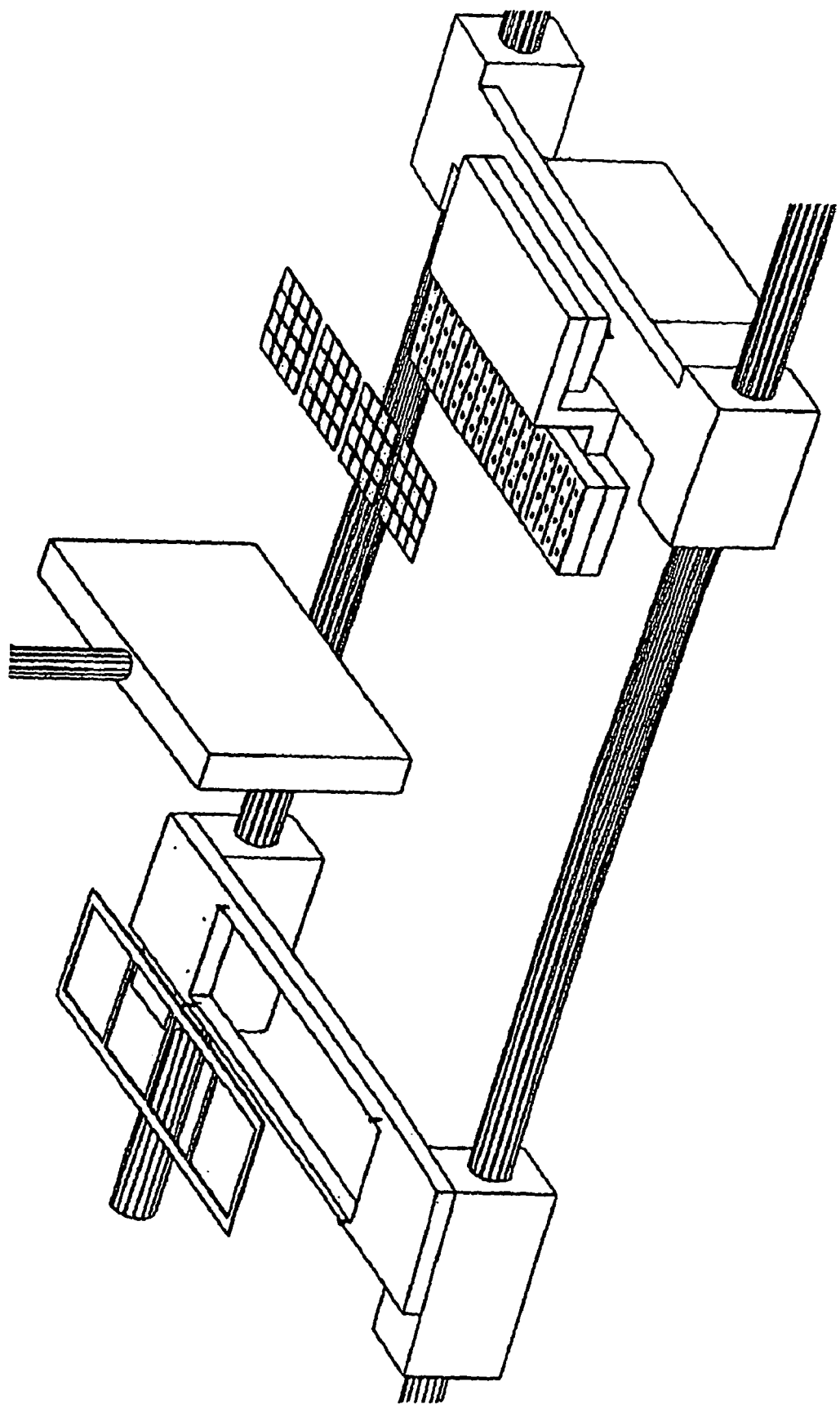
FIG. 13 is a perspective view after the entire cutting procedure has been completed illustrating the items cut from the sheet material as well as the wastage portion of the sheet material.

During cutting of the sheet in the first cutting procedure, a path as for example shown in FIG. 9 may be defined. Accurate cuts in a Y direction are provided in this first cutting procedure and to provide continuation between the X direction cuts, accelerated cutting of the sheet material in the X direction may be provided. After the first cutting procedure to define the path as for example shown in FIG. 9, no separated elements from the sheet material are defined and hence the sheet material still remains intact save for those portions which have been cut away along the path of cutting by the cutting means.

In preparation for the second cutting procedure the support table 102b is moved to become positioned beneath the sheet material. However the sheet material still remains, and in addition, supported by the first support means 102a. The support table 102b merely positions itself to be located beneath the opening 150 of the first support means 102a. The support table is able to move in the X direction and in the Z direction so as to be positioned accordingly. The support table provides slots there through which are commensurate with the path to be cut by the cutting means through the sheet material in the second cutting procedure. The path to be cut during the second cutting procedure is as for example shown in FIG. 11 wherein accurate cuts are made in the X direction and accelerated cuts may be made in the Y direction in moving between the X direction cuts. The slot or slots in the support means are substantially commensurate with the path or paths cut by the cutting means during the second cutting procedure. Since the X direction cuts traverse against the Y direction cuts made in the first cutting procedure, separate elements are cut from the sheet material and as for example shown in FIG. 12 or FIG. 13, such separated elements are substantially square or rectangular shapes. These remain upwardly supported by the support table 102b.

The benefit of maintaining the sheet material on the first support means for both the first and second cutting procedure is that no transfer of the sheet material is required to be made to a different support means. The support table merely positions itself to be relied upon in conjunction with the first support means for the second cutting procedure whilst the sheet material still remains in a fixed relationship relative to the first support means. With the provision of such location means as the support pins the sheet material can remain accurately positioned relative to the cutting means thereby ensuring that an accurate repeat of cut is able to be provided.

The invention claimed is:

1. A method of cutting a product of a predetermined shape from a sheet material comprising;
   supporting a sheet material in a first position by a first support means in a fixed relationship therewith
      cutting through said sheet material by moving a line type cutter relative to said sheet material on a line or lines to define part of said predetermined shape whilst said sheet material remains supported by said first support means,
   supporting said sheet material in a second position by a second support means which is moved relative to said first support means, said sheet material remains supported by said first support means
   cutting through said sheet material by moving a line type cutter relative to said sheet material on a line or lines to define the remaining perimeter of said predetermined shape, to thereby cut said predetermined shape from said sheet material
   wherein in said second position said sheet material is provided with upward support to support said predetermined shape to be cut from said sheet material by said second support means and
   wherein in said second position said first support means and second support means includes a through hole commensurate to the line or lines to define the remaining perimeter of said predetermined shape.

2. A method of cutting a product of a predetermined shape from a sheet material comprising
   a) supporting said sheet material by a support means in a position engaging regions of said sheet material non-commensurate with a preliminary line or lines to be cut through said sheet material,
   b) cutting said sheet by a line type cutter on a preliminary line or lines to define a part of the perimeter of said predetermined shape whilst remaining in support by said support means
   c) moving said sheet material and said supporting means to another means of support, wherein said sheet material and said supporting means are overly on said another means of support, wherein said another means of support provides slots which are commensurate with said preliminary line or lines to be cut;
   d) cutting said sheet material by a line type cutter on a said subsequent line or lines to define further perimeter of said predetermined shape until a product of said predetermined shape is separated from said sheet material,
   wherein said upward support to said major surface of said sheet by said or another support means, supports said predetermined shape once separated from said sheet, and wherein said means to support and said another means to support are brought into register with each other prior to cutting of step (c).

3. A method as claimed in claim 2 wherein said product of predetermined shape is separated from said sheet material without repeating steps (c) and (d).

4. A method as claimed in claim 2 wherein a plurality of product of predetermined shape are cut from said sheet material by cutting in said first mentioned cutting step a plurality of discrete lines in said sheet material and cutting in said second mentioned cutting step at least one line in said sheet material to separate said products of predetermined shape.

5. A method as claimed in claim 2 wherein a plurality of product are cut from said sheet material by cutting in said first mentioned cutting step a line in said sheet material and cutting in said second mentioned cutting step at plurality of discrete lines in said sheet material to separate said products of predetermined shape.

6. A method as claimed in claim 2 wherein said or another support means is a support table and said non upwardly supporting region of said support table are slots there through commensurate at least with said subsequent line or lines to be cut through said sheet material.

7. A method as claimed in claim 6 wherein said support table is separate from said first mentioned support means.

8. A method as claimed in claim 2 wherein the first mentioned support means provides support to at least part of the perimeter only of said sheet material.

9. A method of cutting a product of a predetermined shape from a sheet material comprising;
   supporting a sheet material by a first support means,
   cutting through said sheet material by moving a line type cutter relative to said sheet material on a line or lines to define part of the perimeter of said predetermined shape whilst said sheet material remains supported by said first support means in relationship,
   moving said sheet material, remaining in a fixed relationship with said first support means to a position supporting said sheet material relative to and onto a support table,
   whilst said sheet material remains in a fixed relationship with said first support means, cutting through said sheet material moving a line type cutter relative to said sheet material on a line or lines to define the remaining perimeter of said predetermined shape to thereby cut said shape from said sheet material whilst said sheet material is supported on said support table in a fixed relationship,
   wherein said support table includes a through cut extending therethrough commensurate to the line or lines cut to define said remaining perimeter, said support table providing support to said predetermined shape after having been cut from said sheet material, and
   wherein said first support means provides no supporting regions below where the line or lines to be cut during said first mentioned cutting procedure are to be made.

10. A method as claimed in claim 9 wherein sheet material remains supported by said first support means during the cutting of the remaining perimeter.

11. A method as claimed in claim 9 wherein said support means provides upward support to said sheet material at least at regions of the downwardly facing surface of said sheet material not to be cut during said first mentioned cutting procedure.

12. A method as claimed in claim 9 wherein said support means provides upward support to said sheet material at regions of the downwardly facing surface of said sheet material not to be cut during said first mentioned cutting procedure.

13. A method as claimed in claim 9 wherein said support means provides upward support to said sheet material at regions of the downwardly facing surface of said sheet material not to be cut during said second mentioned cutting procedure.

14. A method as claimed in claim 9 wherein said support means provides upward support to said sheet material at the perimeter region only of the downwardly facing surface of said sheet material.

15. A method as claimed in claim 9 wherein said support table is positioned for said second mentioned cutting procedure in an upwardly supporting condition to said sheet material to provide upward support to at least that part of said sheet material from where said predetermined shapes will be generated.

16. A method as claimed in claim 9 wherein sheet material is engaged to said support means during at least said first mentioned cutting procedure by at least two location pins extending through said sheet material.

17. A method as claimed in claim 9 wherein during cutting of said sheet material on a line or lines to define part of the perimeter of said predetermined shape said support means provides support to said sheet material on the support means facing surface of said sheet material immediately adjacent the said line or lines are cut.

18. A method as claimed in claim 9 wherein said second mentioned cutting procedure moves said cutting means to generate a line cut of said sheet material to strike the line of cut generated during said first mentioned cutting procedure.

19. A method as claimed in claim 9 wherein said second mentioned cutting procedure moves said cutting means to generate at least two parallel lines of cut of said sheet material which each traverse across at least two parallel lines of cut generated during said first mentioned cutting procedure.

20. A method as claimed in claim 9 wherein said second mentioned cutting procedure moves said cutting means to generate at least two parallel lines of cut of said sheet material which each extend across at least two parallel lines of cut generated during said first mentioned cutting procedure at right angles.

* * * * *